United States Patent
Suonmaa et al.

(10) Patent No.: US 12,414,259 B2
(45) Date of Patent: Sep. 9, 2025

(54) ELECTRICAL DEVICE AND METHOD FOR COOLING ELECTRICAL DEVICE

(71) Applicant: EPEC OY, Seinäjoki (FI)

(72) Inventors: Mika Suonmaa, Seinäjoki (FI); Ilkka Heikkilä, Seinäjoki (FI)

(73) Assignee: EPEC OY, Seinäjoki (FI)

( * ) Notice: Subject to any disclaimer, the term of this patent is extended or adjusted under 35 U.S.C. 154(b) by 0 days.

(21) Appl. No.: 18/023,667

(22) PCT Filed: Aug. 30, 2021

(86) PCT No.: PCT/FI2021/050586
§ 371 (c)(1),
(2) Date: Feb. 27, 2023

(87) PCT Pub. No.: WO2022/043617
PCT Pub. Date: Mar. 3, 2022

(65) Prior Publication Data
US 2023/0284412 A1    Sep. 7, 2023

(30) Foreign Application Priority Data
Aug. 31, 2020   (FI) ...................................... 20205844

(51) Int. Cl.
H05K 7/20       (2006.01)
H05K 5/06       (2006.01)
(52) U.S. Cl.
CPC ........... H05K 7/20154 (2013.01); H05K 5/06 (2013.01)
(58) Field of Classification Search
CPC .............................. H05K 7/20154; H05K 5/06

USPC ........................................................ 361/688
See application file for complete search history.

(56) References Cited

U.S. PATENT DOCUMENTS

| | | | | |
|---|---|---|---|---|
| 3,710,295 A | * | 1/1973 | Staub ................... | H01H 85/046 337/204 |
| 3,810,063 A | | 5/1974 | Blewitt | |
| 4,050,045 A | * | 9/1977 | Motten, Jr. ............ | H01H 85/47 337/414 |

(Continued)

FOREIGN PATENT DOCUMENTS

| | | |
|---|---|---|
| CN | 101206514 | 6/2008 |
| CN | 109714935 | 5/2019 |

(Continued)

OTHER PUBLICATIONS

JP-2014020115-A English translation (Year: 2014).*

(Continued)

*Primary Examiner* — Anatoly Vortman
(74) *Attorney, Agent, or Firm* — Nixon & Vanderhye PC

(57) ABSTRACT

In the solution put forth, an electrical device (1) comprises a hermetically sealed enclosure (2), at least one fuse (4) and other electrical components inside the enclosure (2), as well as a heatsink (5) outside the hermetically sealed enclosure (2). The at least one fuse (4) is connected to the heatsink (5) with heat conducting material (8). The heatsink (5) is adapted to conduct heat from the fuse to outside of the enclosure (2). The heatsink (5) features a channel (6) for a cooling medium for transferring heat from the heatsink (5) by making use of the cooling medium, whereby the heatsink (5) is a medium-cooled heatsink (5).

18 Claims, 3 Drawing Sheets

(56) References Cited

U.S. PATENT DOCUMENTS

| | | | | |
|---|---|---|---|---|
| 4,216,456 | A * | 8/1980 | Hotta | H01H 87/00 337/202 |
| 5,179,436 | A * | 1/1993 | Asdollahi | H01H 85/0417 337/203 |
| 5,582,242 | A * | 12/1996 | Hamburgen | H01L 23/427 29/890.032 |
| 5,742,478 | A * | 4/1998 | Wu | H05K 7/20445 361/728 |
| 5,966,291 | A | 10/1999 | Baumel et al. | |
| 6,046,908 | A * | 4/2000 | Feng | H05K 7/20154 361/730 |
| 6,067,229 | A * | 5/2000 | Johnson | H05K 7/20409 361/689 |
| 6,108,194 | A * | 8/2000 | Seligman | H05K 5/0204 361/728 |
| 6,275,135 | B1 * | 8/2001 | Hibayashi | H01H 85/1755 337/252 |
| 6,294,978 | B1 * | 9/2001 | Endo | H01H 85/044 337/159 |
| 6,374,912 | B1 * | 4/2002 | LaGrotta | H05K 7/20409 174/559 |
| 6,411,514 | B1 * | 6/2002 | Hussaini | H05K 7/209 361/689 |
| 6,522,528 | B2 * | 2/2003 | Yamane | B60R 16/0238 361/601 |
| 6,573,616 | B2 * | 6/2003 | Yamane | B60R 16/0239 307/10.1 |
| 6,650,559 | B1 * | 11/2003 | Okamoto | H01L 25/162 363/141 |
| 6,710,696 | B2 * | 3/2004 | Meiners | H01H 85/2045 337/186 |
| 6,757,168 | B2 * | 6/2004 | Yatougo | H05K 7/20145 361/692 |
| 6,911,598 | B2 * | 6/2005 | Onizuka | H05K 7/026 361/752 |
| 7,154,753 | B2 * | 12/2006 | Kobayashi | H05K 7/20854 257/706 |
| 7,245,485 | B1 * | 7/2007 | Morrell | H05K 7/20736 361/679.48 |
| D596,175 | S * | 7/2009 | Viertola | D14/371 |
| D650,815 | S * | 12/2011 | Pellervo Viertola | D15/28 |
| 8,582,294 | B2 * | 11/2013 | Guerin | H01G 2/08 320/112 |
| D719,984 | S * | 12/2014 | Viertola | D15/28 |
| D730,895 | S * | 6/2015 | Anundi | D14/371 |
| 2005/0253465 | A1 | 11/2005 | Takenaka et al. | |
| 2007/0247823 | A1 | 10/2007 | Falk et al. | |
| 2008/0049476 | A1 | 2/2008 | Azuma et al. | |
| 2013/0062724 | A1 * | 3/2013 | Tokuyama | H05K 7/1432 257/734 |
| 2014/0096938 | A1 * | 4/2014 | Kojima | H01L 23/473 165/104.19 |
| 2015/0357144 | A1 | 12/2015 | Pal | |
| 2018/0294125 | A1 | 10/2018 | Yoneda et al. | |

FOREIGN PATENT DOCUMENTS

| | | |
|---|---|---|
| CN | 209861467 | 12/2019 |
| DE | 2745110 | 4/1978 |
| DE | 9015208 | 1/1991 |
| EP | 2 590 201 | 5/2013 |
| ES | 2 325 184 | 8/2009 |
| FR | 1337709 | 9/1963 |
| JP | 2003-110266 | 4/2003 |
| JP | 2014020115 A * | 2/2014 |
| JP | 2016-063051 | 4/2016 |

OTHER PUBLICATIONS

Search Report for FI Application No. 20205844 dated Mar. 10, 2021, 1 page.

International Search Report for PCT/FI2021/050586 dated Nov. 23, 2021, 7 pages.

Written Opinion of the ISA for PCT/FI2021/050586 dated Nov. 23, 2021, 8 pages.

Mar. 30, 2023 Office Action issued in Finnish Patent Application No. 20205844, pp. 1-7 [machine translation included].

Jan. 21, 2025 Office Action issued in Chinese Patent Application No. 202180052815.2, pp. 1-8 [machine translation included].

* cited by examiner

ELECTRICAL DEVICE AND METHOD FOR COOLING ELECTRICAL DEVICE

CROSS-REFERENCE TO RELATED APPLICATIONS

This application is the U.S. national phase of International Application No. PCT/FI2021/050586 filed Aug. 30, 2021 which designated the U.S. and claims priority to FI 20205844 filed Aug. 31, 2020, the entire contents of each of which are hereby incorporated by reference.

BACKGROUND OF THE INVENTION

The invention relates to electrical devices and in particular to cooling electrical devices.

In electrical devices, heat causes stress on the components in the device. The resistance of the components causes heat losses in them. The higher the current passing through the component is, the larger the heat loss and heat generated that way. In challenging conditions, in particular, such as with work machines, it is important that heat does not rise to too high a level.

BRIEF DESCRIPTION OF THE INVENTION

It is an object of the invention to provide a new electrical device and a method for cooling the electrical device.

In the solution put forth, the electrical device comprises a hermetically sealed enclosure, at least one fuse and other electrical components inside the enclosure, as well as a heatsink outside the hermetically sealed enclosure. The at least one fuse is connected to a wall of the heatsink or a cooling piece connected to the wall of the heatsink, by heat-conducting material whereby there is heat-conducting material adapted between a sheath of the fuse and the wall of the heatsink or between the sheath of the fuse and the cooling piece. The heatsink is adapted to conduct heat from the fuse to outside of the enclosure. The heatsink features a channel for a cooling medium for transferring heat from the heatsink by making use of the cooling medium, whereby the heatsink is a medium-cooled heatsink. Heat can be conducted off a body of the fuse. This means that the electrical device can be efficiently cooled and the electrical device as a whole extremely well withstands most difficult environmental conditions.

According to an embodiment, a part of the heatsink wall is part of the enclosure wall part. This allows heat to be efficiently and simply conducted from the fuse to the heatsink, and the overall structure is simple and durable.

According to an embodiment, the channel in the heatsink forms a recess inward in the enclosure. This allows the structure of the electrical device to be made compact, and at the same time the heat transfer surface from the inside of the enclosure to the heatsink fairly wide.

According to an embodiment, the channel has an inlet and an outlet of the cooling medium at the same first end of the channel. The channel has an inlet side and return side which are for the most part separated from each other with an intermediate wall and connected to each other in the vicinity of the end opposite in relation to said first end. This way the cooling medium can be made flow for a long distance inside the channel with a structurally simple solution.

According to an embodiment, said at least one fuse is adapted in connection with the inlet side of the channel. This way, the cooling medium led to the fuse efficiently cools the fuse.

According to an embodiment, there are guides in the channel to guide the flow of the cooling medium. The guides may be ribs or recesses, for example. The guides may be adapted to form turbulence in the cooling medium flow. This way, the cooling medium may be led to a desired location in a simple manner, and the cooling medium may be made to transfer heat off the fuse very efficiently.

BRIEF DESCRIPTION OF THE DRAWINGS

The invention is now described in closer detail in connection with some embodiments and with reference to the accompanying drawings, in which.

DETAILED DESCRIPTION OF THE INVENTION

Figure 1:
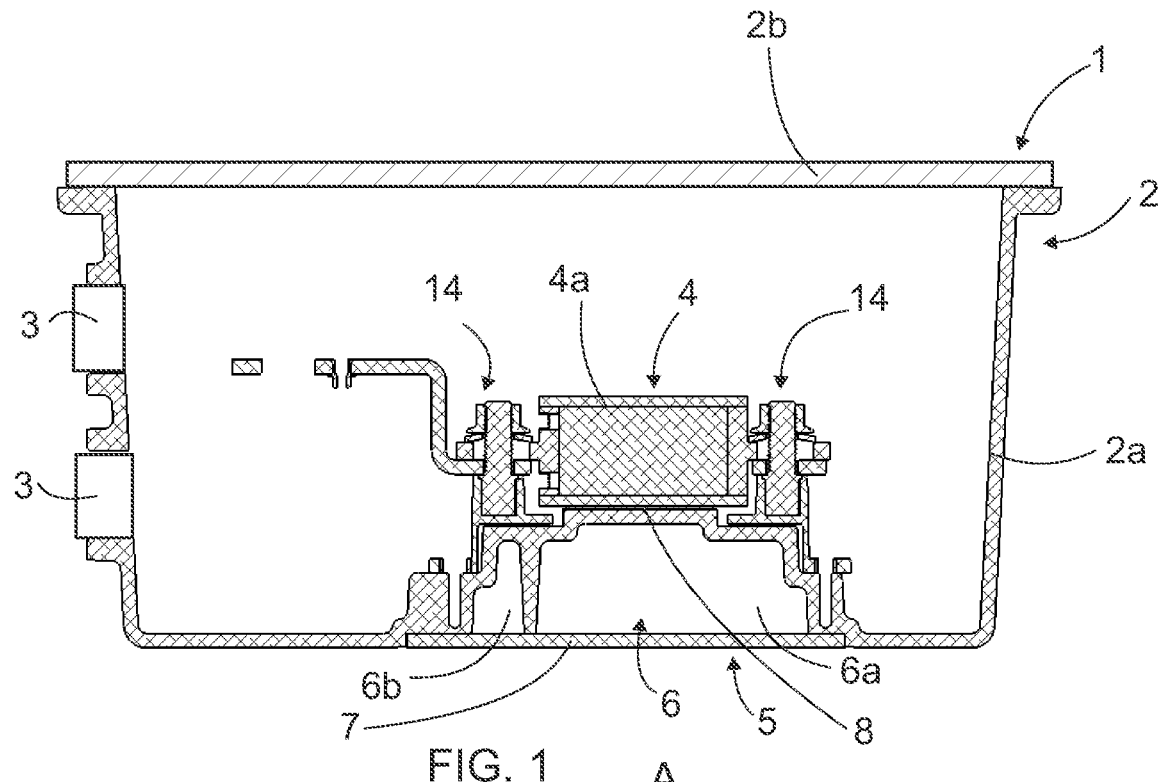
FIG. 1 is a schematic end view of an electrical device in cross section along line A-A of FIG. 2.

FIG. 1 shows an electrical device 1. The electrical device 1 may be a switch box, power distribution unit, or another device having an enclosure inside which there are electrical components. Electrical components may comprise one or more of the following: fuse, contactor, control unit, connector, conductor, etc. The voltage of the electrical device 1 may be in the 100 to 2000 V range, and the current passing through it in the 50 to 1000 A range.

The electrical device 1 has an enclosure 2 which has an enclosure part 2a and a cover 2b. The gap between the cover 2b and enclosure part 2a, as well as the gaps between e.g the connectors 3 and enclosure part 2a are sealed so that the enclosure 2 is hermetically closed. Since the enclosure 2 is hermetically sealed, the electrical components within are effectively protected against environmental conditions. For reasons of clarity, fuses 4, only, are shown of the electrical components inside the enclosure.

The enclosure part 2a of the enclosure 2 forms the side walls and bottom wall of the enclosure 2. The cover 2b of the enclosure 2 forms the cover wall of the enclosure 2. The electrical device 1 further comprises a heatsink 5 on the outside of the hermetically sealed enclosure 2. The heatsink 5 is formed in connection with the enclosure 2 so that the bottom wall of the enclosure 2 forms a recess, or as seen from the inside of the enclose 2, a protrusion, towards the inside of the enclosure 2. The heatsink 5 thus has a channel 6 for a cooling medium. The channel 6 of the heatsink 5 is closed on its bottom side by a bottom cover 7 of the heatsink. So, the bottom wall of the enclosure 2 forms the top wall and side walls of the heatsink 5. The heatsink 5 is therefore partly integrated with the structure of the enclosure 2 although the heatsink 5 is outside the hermetically sealed enclosure 2.

At the heatsink 5, at least, the material of the enclosure 2 is well heat conducting. The entire enclosure 2 may also be made of one material. Said well heat conducting material of the enclosure 2 may be metal, such as aluminium.

The fuses 4 are by their lower part connected to the top part of the heatsink 5 with well heat conducting material 8. The well heat conducting material 8 is adapted between the sheath 4a of the fuse and the wall of the heatsink 5. This well heat conducting material may be paste, such as silicone paste or another well heat conducting paste. Further, the well heat conducting material may be another deformable intermediate material such as flexible elastic material. With the well heat conducting material 8, the sheath 4a of the fuse 4 is firmly brought against the wall of the heatsink 5, whereby any roughness on the sheath and/or wall do not reduce heat conduction.

In the attached drawings in connection with the electrical device 1, there is one heatsink 5, only, located in the bottom part of the enclosure 2. If so desired, the heatsink 5 may also be adapted on the sides and/or cover of the enclosure 2. The electrical device 1 may further have two or more heatsinks 5.

Figure 2:
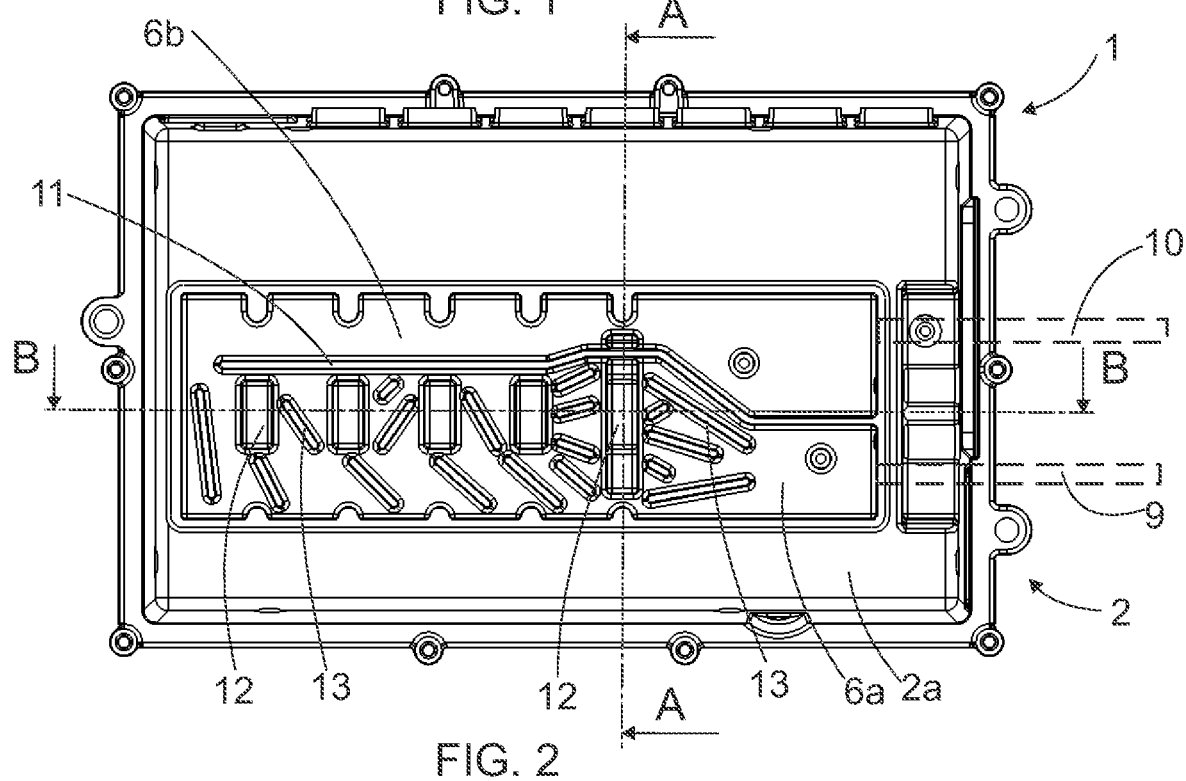
FIG. 2 is a schematic bottom view of the electrical device of FIG. 1 with the bottom cover of the heatsink removed.
Figure 3:
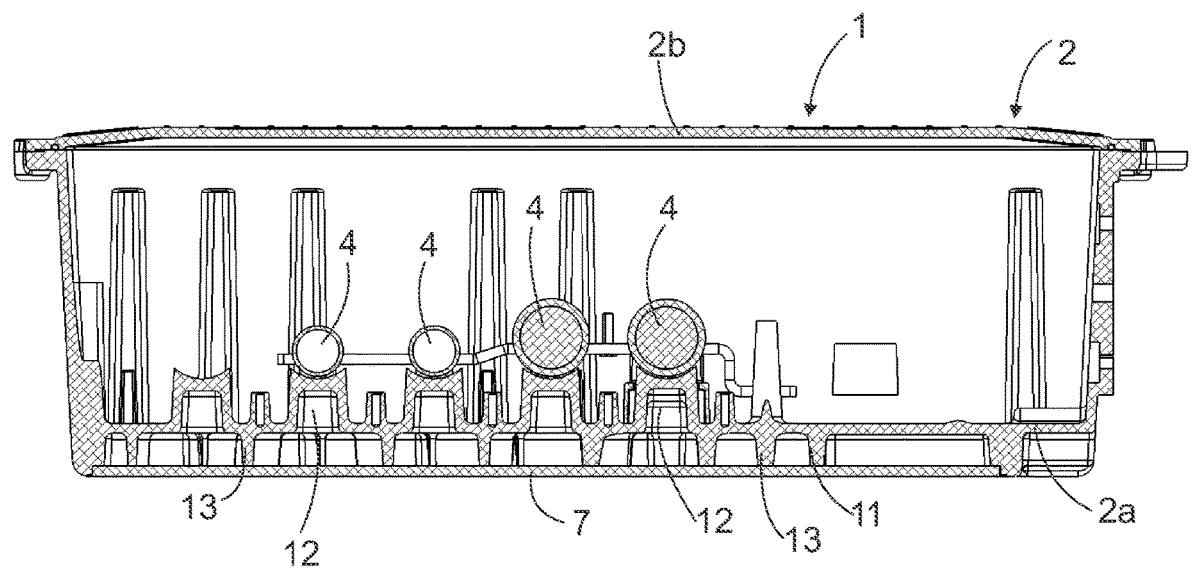
FIG. 3 is a schematic side view of the electrical device of FIG. 1 in cross section along line B-B of FIG. 2.

Cooling medium is led to the channel 6 from the inlet 9 and the cooling medium is removed from the channel 6 from the outlet 10. The inlet 9 and outlet 10 as well as the connections and pipes connected to them are schematically illustrated with broken lines in FIG. 2. The cooling medium is a fluid suitable for the purpose. For example, the cooling medium may be pressurised air, water, or coolant such as glycol. After having passed through the heatsink 5, the cooling medium may be led to a separate cooler, for example. The cooling medium may also be fuel, for example, which warms up appropriately when passing through the heatsink to be used in a combustion engine.

The channel 6 has an intermediate wall 11 which divides the channel 6 into an inlet side 6a and return side 6b. The intermediate wall 11 extends from the end on the side of the inlet 9 and outlet 10 to nearby the opposite end in relation to them. This allows the cooling medium to flow, at said opposite end, from the inlet side 6a to the return side 6b. For the most part, the inlet side 6a has a larger cross section than the return side 6b. This means that the volume of the inlet side 6a is larger than the volume of the return side 6b. However, the first part of the inlet side 6a may have a smaller cross section than the end part of the return side 6b. When entering the channel 6, the cooling medium is at its coolest, and when the inlet side 6a has a larger cross section than the return side 6b, the effect of the cooling medium can be applied to the components to be cooled as efficiently as possible. The return side 6b may be smaller than the inlet side 6a because the cooling requirement in connection with the return side 6b is lesser.

To guide the flow of the cooling medium, there are guides formed in the channel 6. The guides are formed in connection with the inlet side 6a, in particular, because the fuses 4 to be cooled are also adapted in connection with the inlet side 6a. This allows the cooling medium to flow as desired in connection with the component being cooled such as in a turbulent manner, for example. There is no need for turbulence in connection with the return side 6b whereby the return side may be more straightforward.

The guides may be recesses 12 or ribs 13, for example. The recesses 12 form supports for the fuses 4. The ribs 13 may extend from the top part of the channel 6 all the way to the bottom cover 7 of the heatsink.

Further, at the ends of the fuses 4, there are clamps 14. The fuses 4 are replaceable, that is, the fuses 4 are removably attached to the clamps 14.

Figure 4:
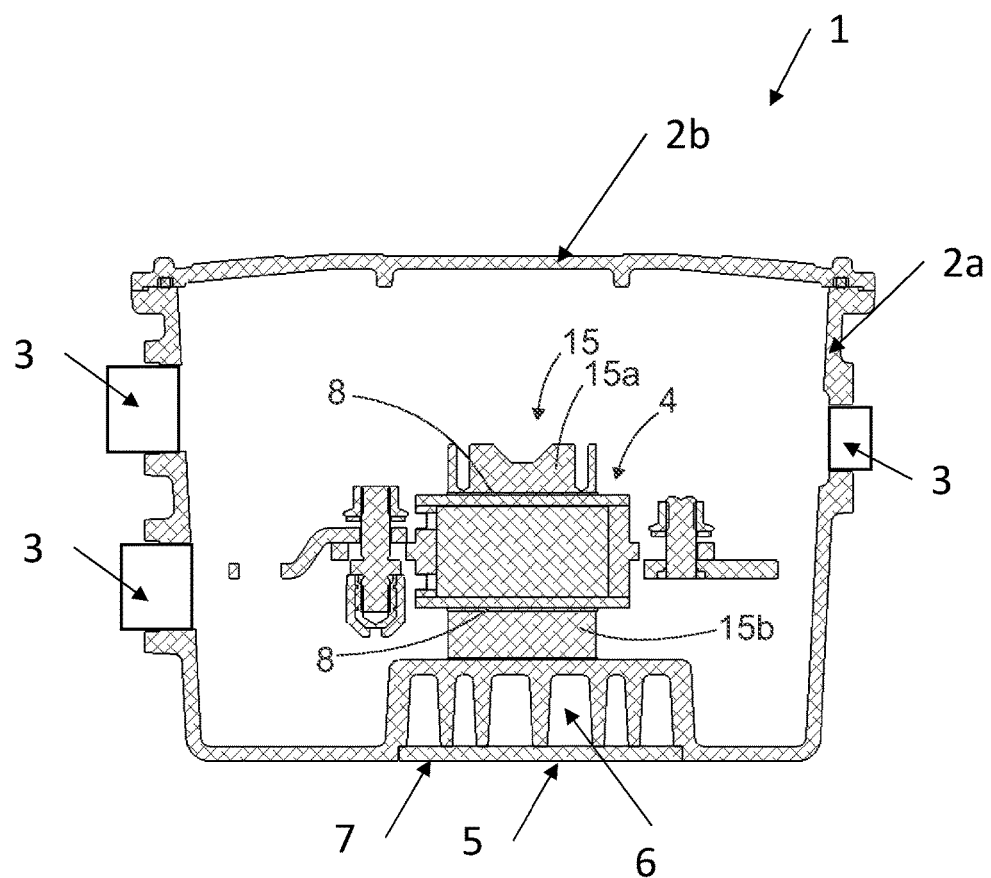
FIG. 4 is a schematic end view of a second electrical device in cross section along line C-C of FIG. 5.
Figure 5:
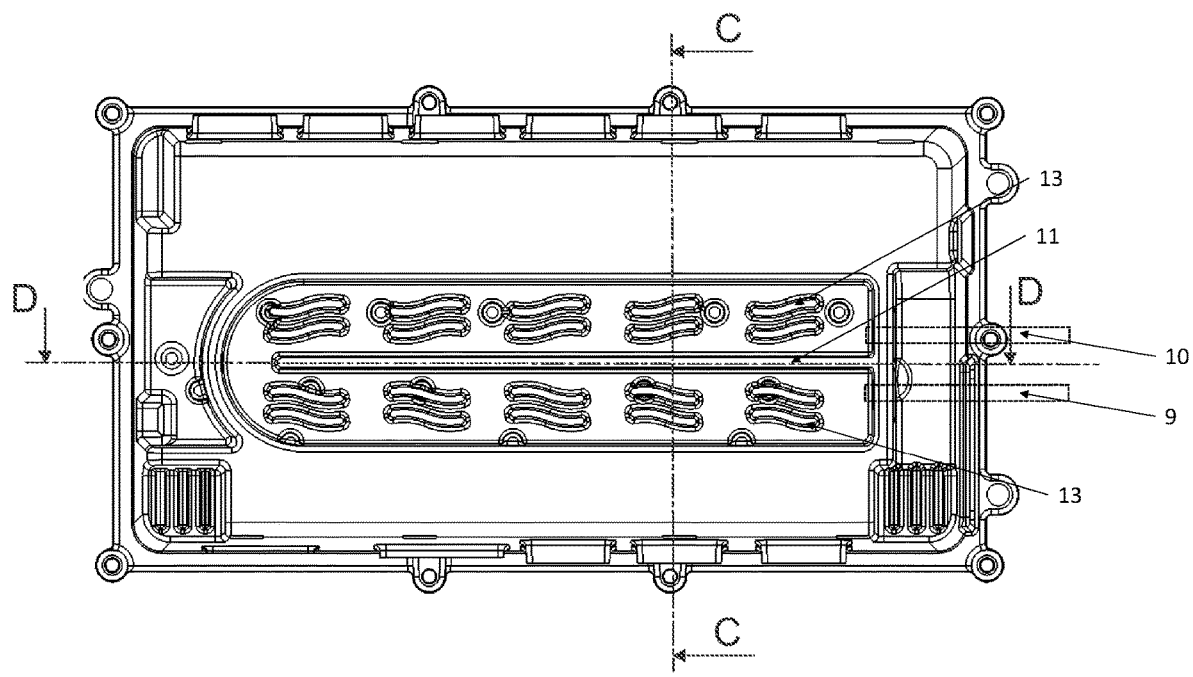
FIG. 5 is schematic bottom view of the electrical device of FIG. 4 with the bottom cover of the heatsink removed.
Figure 6:
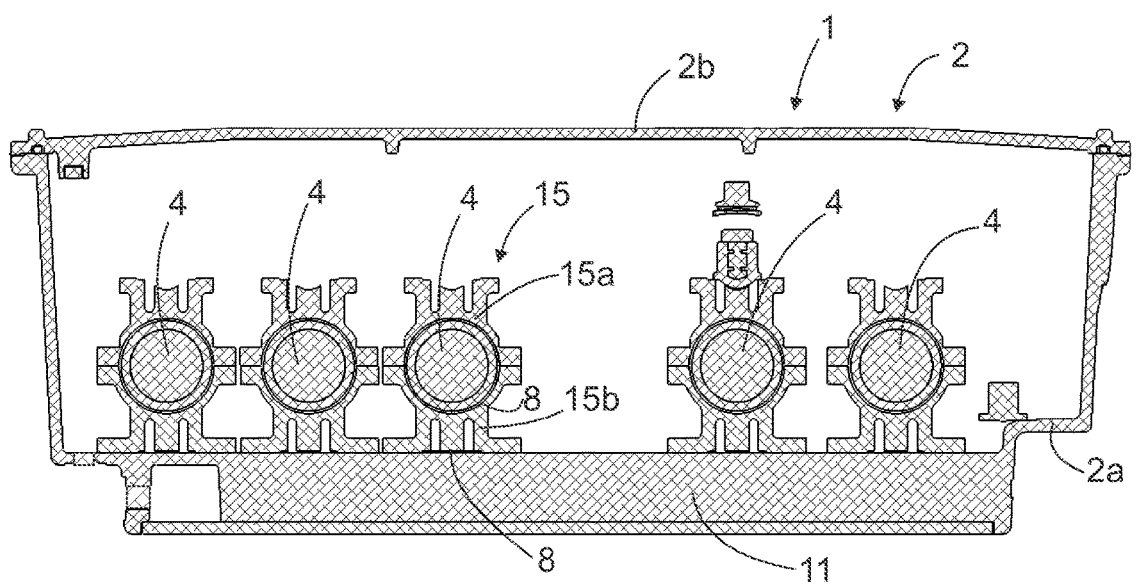
FIG. 6 is schematic side view of the electrical device of FIG. 4 in cross section along line D-D of FIG. 5.

In the embodiment of FIGS. 4, 5 and 6, there are cooling pieces 15 in the electrical device 1. The fuse 4 is connected to the cooling piece 15, which in turn is connected to the wall of the heatsink 5.

The fuses 4 are connected to the cooling piece 15 with a well heat conducting material 8. The well heat conducting material 8 is adapted between the sheath 4a of the fuse and the cooling piece 15. With the well heat conducting material 8, the sheath 4a of the fuse 4 is firmly brought against the cooling piece 15, whereby any roughness on the sheath and/or cooling piece 15 do not reduce heat conduction.

The cooling pieces 15 are connected by their lower part to the top part of the heatsink 5 with the well heat conducting material 8. The well heat conducting material 8 is adapted between the cooling piece 15 and the wall of the heatsink 5. With the well heat conducting material 8, the cooling piece 15 is firmly brought against the wall of the heatsink 5, whereby any roughness on the cooling piece and/or wall do not reduce heat conduction. As relates to the shape, the top surface of the heatsink 5, that is, the surface towards the inside of the enclosure 2, is substantially straight in the embodiment of FIGS. 4, 5 and 6. This allows the cooling pieces 15 to be installed in a simple and reliable manner in connection with the wall of the heatsink 5.

The cooling piece 15 is provided around the fuse 4. This allows efficient cooling of the fuse 4. There is heat conducting material 8 provided around the fuse 4 between the fuse 4 and cooling piece 15. This allows efficient transfer of heat from the fuse 4 to the cooling piece 15.

The cooling piece 15 may be formed of one or more parts. In case the cooling piece 15 is formed of more than one part, the parts of the cooling piece 15 may be fixedly or removably attached to each other. The parts of the cooling piece may be fastened to each other e.g. by welding, soldering, or by a screw joint, or another suitable fastening method. When the parts of the cooling piece 15 are removably attached to each other, the fuse 4 adapted inside them may be easily replaced.

In the embodiments of FIGS. 4, 5, and 6, the cooling pieces 15 comprise a top part 15a of the cooling piece and a bottom part 15b of the cooling piece. The top part 15a of the cooling piece is removably fastened to the bottom part 15b of the cooling piece. The bottom part 15b of the cooling piece is connected to the wall of the heatsink 5. There is well heat conducting material 8 between the bottom part 15b of the cooling piece and the wall of the heatsink 5.

In the embodiment of FIGS. 4, 5, and 6, the volume of the inlet side 6a of the channel 6 in the heatsink 5 is substantially as large as the volume of the return side 6b. The guides for guiding the flow of the cooling medium are ribs 13. In the direction of flow, the ribs 13 have a waveform whereby they effectively form turbulence in the flow.

In the attached drawings, the fuses 4 are cylindrical whereby their cross section is circular. The cross section of the fuses may also be angular.

Those skilled in the art will find it obvious that, as technology advances, the basic idea of the invention may be implemented in many different ways. The invention and its embodiments are thus not restricted to the examples described above but may vary within the scope of the claims.

The invention claimed is:

1. An electrical device, comprising:
   a hermetically sealed enclosure,
   at least one fuse and other electrical components located inside the hermetically sealed enclosure, and
   a heatsink located outside the hermetically sealed enclosure, wherein the at least one fuse is connected to a wall of the heatsink or a cooling piece connected to the wall of the heatsink, by heat conducting material, wherein the heat conducting material is provided between a casing of the at least one fuse and the wall of the heatsink or between the casing of the at least one fuse and the cooling piece, the heatsink being configured to conduct heat from the at least one fuse to outside of the hermetically sealed enclosure, and wherein the heatsink includes a channel configured to accommodate a cooling medium, the cooling medium being configured to facilitate heat transfer from the heatsink, the heatsink being a medium-cooled heatsink.

2. The electrical device as claimed in claim 1, wherein a part of the heatsink wall forms a portion of a wall of the hermetically sealed enclosure.

3. The electrical device as claimed in claim 2, wherein the channel forms a recess inward in the hermetically sealed enclosure.

4. An electrical device as claimed in claim 1, wherein the cooling piece is provided around the at least one fuse and the heat conducting material is provided around the at least one fuse between the at least one fuse and cooling piece.

5. The electrical device as claimed in claim 1, wherein the heat conducting material is provided between the cooling piece and the wall of the heatsink.

6. The electrical device as claimed in claim 1, wherein the heat conducting material is deformable.

7. The electrical device as claimed in claim 6, wherein the heat conducting material is a flexible elastic material.

8. The electrical device as claimed in claim 1, wherein the hermetically sealed enclosure includes fuse clamps to which the at least one fuse is removably fastened.

9. The electrical device as claimed in claim 1, wherein the channel has an inlet and an outlet for the cooling medium, the inlet and outlet being located at a common first end of the channel, the channel having an inlet side and a return side that are separated from each other with an intermediate wall and connected to each other proximate to a second end of the channel, the second end being opposite to the first end.

10. The electrical device as claimed in claim 1, wherein the channel includes guides configured to guide the cooling medium flow.

11. The electrical device as claimed in claim 10, wherein the guides are ribs and recesses.

12. The electrical device as claimed in claim 10, wherein the guides are configured to form turbulence in the cooling medium flow.

13. The electrical device as claimed in claim 11, wherein the guides are configured to form turbulence in the cooling medium flow.

14. A method for cooling an electrical device, the method comprising:

moving a cooling medium in a heatsink to transfer heat away from the heatsink by the cooling medium, wherein the electrical device comprises a hermetically sealed enclosure, at least one fuse and other electrical components being located inside the hermetically sealed enclosure, wherein the heatsink is located outside the hermetically sealed enclosure, wherein the at least one fuse is connected to a wall of the heatsink or a cooling piece connected to the wall of the heatsink, by heat conducting material, wherein the heat conducting material is located between a casing of the at least one fuse and the wall of the heatsink or between the casing of the at least one fuse and the cooling piece, wherein heat is conducted by the heatsink from the at least one fuse to outside of the hermetically sealed enclosure.

15. The method as claimed in claim 14, wherein the heatsink has a channel and the channel has an inlet and an outlet for the cooling medium, the inlet and outlet being located at a common first end of the channel, the channel having an inlet side and a return side that are separated from each other with an intermediate wall and connected to each other proximate to a second end of the channel, the second end being opposite to the first end.

16. The method as claimed in claim 14, wherein a cooling piece is provided around the at least one fuse, and the heat conducting material is provided around the at least one fuse between the at least one fuse and the cooling piece.

17. The method as claimed in claim 14, wherein the heat conducting material is provided between the cooling piece and the wall of the heatsink.

18. The method as claimed in claim 14, wherein turbulence is formed in the cooling medium flow.

* * * * *